(12) United States Patent
Hon et al.

(10) Patent No.: US 6,215,358 B1
(45) Date of Patent: Apr. 10, 2001

(54) TEMPERATURE COMPENSATED BIAS NETWORK FOR A POWER AMPLIFIER AND METHOD OF OPERATION

(75) Inventors: Terry Hon, Wylie; Mark J. Appel, Richardson; George A. Bednekoff, Plano, all of TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/397,224

(22) Filed: Sep. 16, 1999

(51) Int. Cl.<sup>7</sup> ........................................................ H03F 3/04
(52) U.S. Cl. .............................................. 330/289; 330/296
(58) Field of Search ........................................ 330/289, 285, 330/296

(56) References Cited

U.S. PATENT DOCUMENTS 5,177,453 * 1/1993 Russell et al. ....................... 330/284
5,724,004 * 3/1998 Reif et al. ............................ 330/277
5,818,301 * 10/1998 Higashiyama et al. .............. 330/266
5,873,029 * 2/1999 Grondahl et al. .................... 455/126

* cited by examiner

Primary Examiner—Robert Pascal
Assistant Examiner—Henry Choe
(74) Attorney, Agent, or Firm—John C. Han

(57) ABSTRACT

There is disclosed, for use in an RF amplifier, a biasing circuit for maintaining the quiescent current of an output power transistor at a selected bias level. The biasing circuit comprises a temperature sensor circuit for generating a temperature-sensitive control voltage that varies according to changes in temperature of the output power transistor and a bias voltage generating circuit capable of detecting a variation in the temperature-sensitive control voltage. In response to a detected change in the temperature-sensitive control voltage, the bias circuit adjusts a bias voltage applied to the output power transistor by an amount suitable to offset a change in the selected bias current level caused by a temperature change related to the variation in the temperature-sensitive voltage.

14 Claims, 4 Drawing Sheets

TEMPERATURE COMPENSATED BIAS NETWORK FOR A POWER AMPLIFIER AND METHOD OF OPERATION

TECHNICAL FIELD OF THE INVENTION

The present invention is directed, in general, to wireless communications networks and, more specifically, to a system for biasing an RF amplifier in a wireless network base station.

BACKGROUND OF THE INVENTION

Wireless networks, including cellular telephone networks, have become ubiquitous in society. Reliable predictions indicate that there will be over 300 million cellular telephone customers by the year 2000. In order to maximize the number of subscribers that can be serviced in a single cellular system, frequency reuse is increased by making individual cell sites smaller and using a greater number of cell sites to cover the same geographical area. To maximize usage of the available bandwidth in each cell, a number of multiple access technologies have been implemented to allow more than one subscriber to communicate simultaneously with each base transceiver station (BTS) in a wireless system. These multiple access technologies include time division multiple access (TDMA), frequency division multiple access (FDMA), and code division multiple access (CDMA). These technologies assign each system subscriber to a specific traffic channel that transmits and receives subscriber voice/data signals via a selected time slot, a selected frequency, a selected unique code, or a combination thereof.

Every cellular base station has an RF transmitter for sending voice and data signals to mobile units (i.e., cell phones, portable computers equipped with cellular modems, and the like) and a receiver for receiving voice and data signals from the mobile units. It is important that the RF power amplifier in a base station transmitter operate in a highly linear manner, especially when amplifying a signal whose envelope changes in time over a wide range, as in CDMA and multi-carrier systems. It also is important that the RF amplifier have good linearity characteristics across a wide range of operating conditions, because wireless systems cannot tolerate large amounts of signal distortion and may not violate adjacent channel power specifications, such as the IS 95 bandwidth requirements, regarding spectral spreading effects.

The output stage of an RF amplifier typically contains a high-power transistor, such as a class AB laterally diffused metal-oxide-silicon field-effect transistor (LDMOS FET), a gallium-arsenide (GaAs) FET, or, perhaps, a bipolar junction transistor (BJT). In order to maintain linear operation in the RF amplifier, the bias voltage of the output stage high-power transistor must be adjusted so that the bias current of the high-power transistor remains constant over a range of temperature.

For example, in an LDMOS FET, the gate-to-source bias voltage ($V_{gs}$) must vary such that the quiescent current ($I_{dq}$) remains constant as temperature rises. To maintain constant $I_{dq}$ over a temperature range, the gate voltage must decrease as temperature increases. The desired slope (mV/C) of the gate voltage varies from one device to the next due to process variation. If $I_{dq}$ is not constant over temperature, the device linearity or adjacent channel power ratio (ACPR) degrades. If the ACPR degrades, the RF amplifier output power must be reduced to the point at which it again complies with the J-STD-019 spectral mask. This reduction in output power decreases the overall range and capacity of cellular and PCS base stations.

One technique for biasing the output power transistor is to use a fixed-bias voltage. The fixed-bias approach is generally implemented with a simple voltage divider or adjustable reference voltage. Unfortunately, this technique is not capable of compensating the bias voltage over temperature, nor is it capable of compensating for lot-to-lot device variations. Furthermore, the fixed-bias technique is subject to thermal runaway. If the bias voltage is not temperature compensated, the bias current becomes very large with increased temperature. Under full RF drive conditions, the increase in bias current may become so large that the device overheats to the point of failure. Regardless of failure, the device mean-time-to-failure (MTTF) degrades with increased current and temperature.

Another technique for biasing the output power transistor involves the use of microprocessors and/or electronically programmable resistor arrays. This approach is much more complex and costly and requires input and output data from a master controller card. Furthermore, in order to measure and adjust the quiescent current, the RF input signal to the output power transistor must be temporarily shut off. Obviously, when the RF input signal is removed, the base station no longer transmits and all calls must be dropped. Thus, the base station must go out-of-service just prior to and during adjustment of the bias current.

There is therefore a need in the art for improved systems and methods of biasing the output power transistor of an RF amplifier to compensate for temperature variations. In particular, there is a need for temperature-compensated biasing networks for the output power transistor of an RF amplifier that are simple and inexpensive and that do not require that the base station be temporarily put out of service.

SUMMARY OF THE INVENTION

To address the above-discussed deficiencies of the prior art, it is a primary object of the present invention to provide, for use in an RF amplifier containing an output power transistor having a quiescent current set at a selected bias current level, a biasing circuit for maintaining the quiescent current at the selected bias level. The bias circuit comprises 1) a temperature sensor circuit capable of generating a temperature-sensitive control voltage that varies according to changes in temperature of the output power transistor; and 2) a bias voltage generating circuit capable of detecting a variation in the temperature-sensitive control voltage and, in response thereto, adjusting a bias voltage applied to the output power transistor by an amount suitable to offset a change in the selected bias current level caused by a temperature change related to the variation in the temperature-sensitive voltage.

According to one embodiment of the present invention, the bias voltage generating circuit comprises amplification means for scaling a voltage change in the temperature-sensitive control voltage to match a required voltage change in the bias voltage.

According to another embodiment of the present invention, the bias voltage generating circuit further comprises an adjustable voltage divider circuit for further scaling the voltage change in the temperature-sensitive control voltage to match the required voltage change in the bias voltage.

According to still another embodiment of the present invention, the bias voltage generating circuit comprises an operational amplifier having a first input coupled to an output of the temperature sensor circuit.

According to yet another embodiment of the present invention, the operational amplifier has a second input coupled to an output of a precision voltage reference circuit.

According to a further embodiment of the present invention, an output of the operational amplifier is proportional to a difference between the precision voltage reference circuit output and the temperature sensor circuit output.

According to another embodiment of the present invention, the precision voltage reference circuit output provides a DC offset voltage in the operational amplifier output.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network and any suitably arranged RF transmitter, including RF transmitters used to transmit television signals and commercial radio signals.

Figure 1:
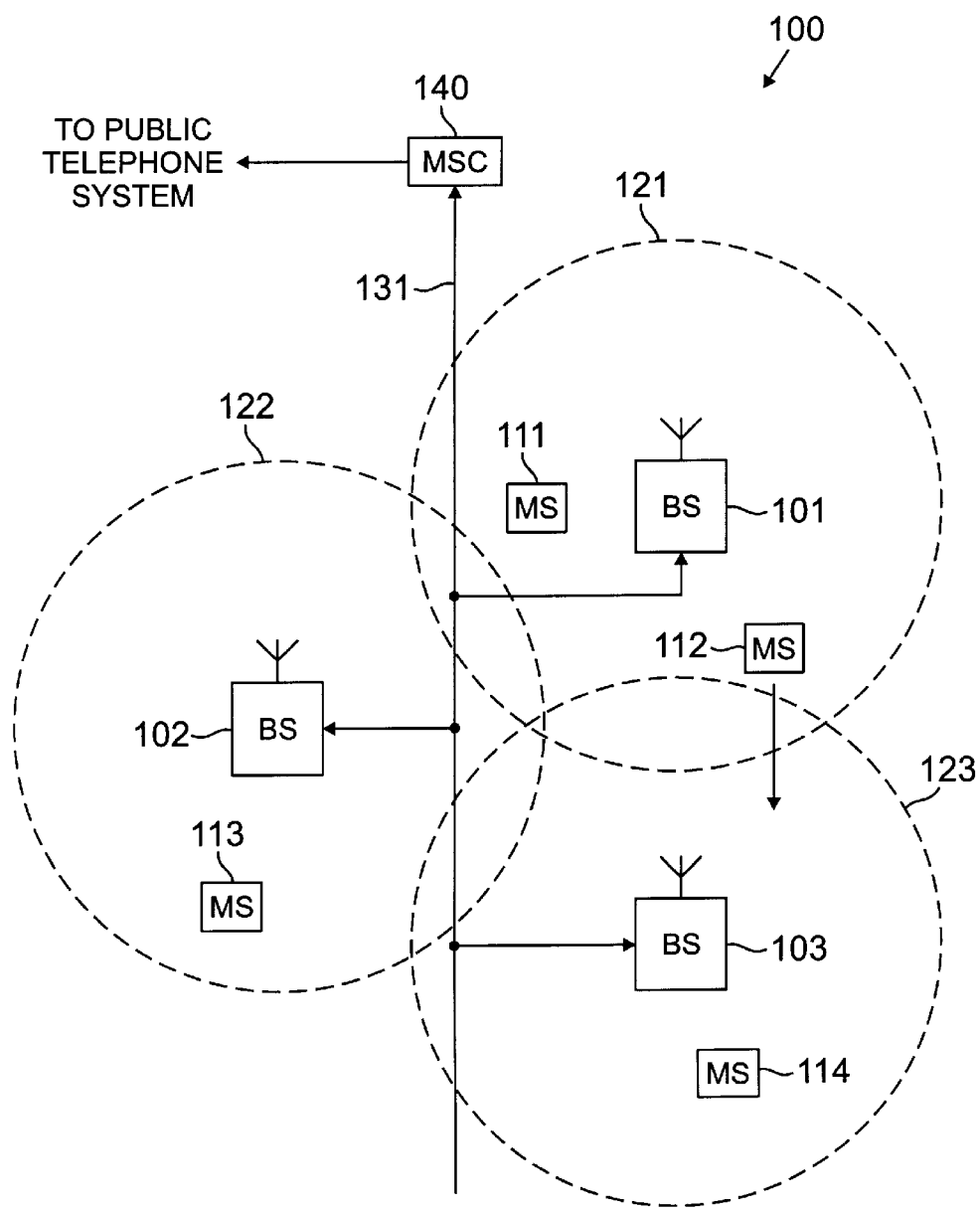
FIG. 1 illustrates an exemplary wireless network according to one embodiment of the present invention.

FIG. 1 illustrates exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cell sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and a base transceiver station (BTS). Base station controllers and base transceiver stations are well known to those skilled in the art. A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, and RF transmitters and RF receivers. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 123 and is in communication with BS 103. The MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well know, the "handoff" procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
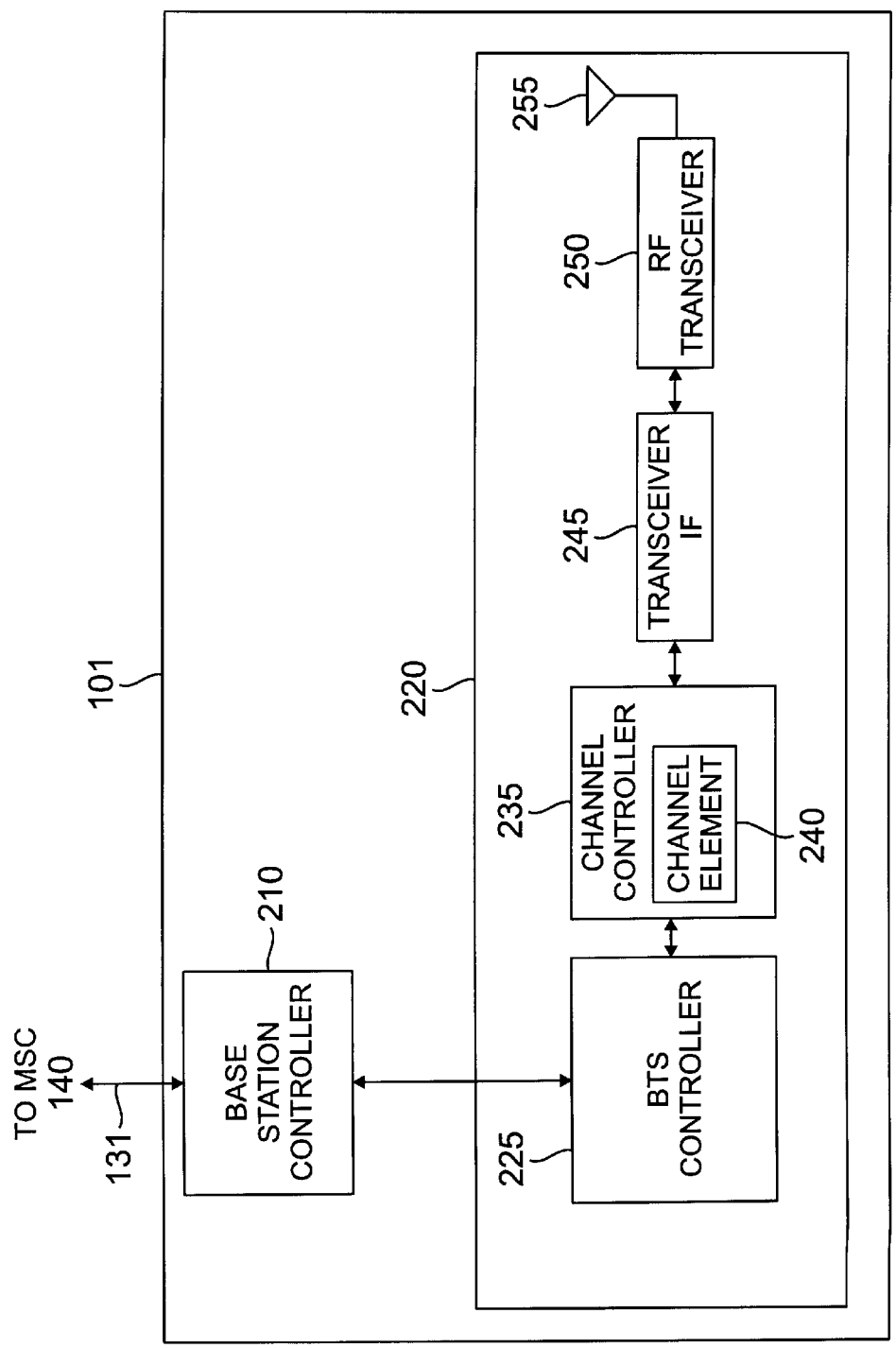
FIG. 2 illustrates in greater detail an exemplary base station according to one embodiment of the present invention.

FIG. 2 illustrates in greater detail exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 120 comprises BTS controller 225, channel controller 235, which contains representative channel element 240, transceiver interface (IF) 245, RF transceiver unit 250, antenna array 255, and channel monitor 260.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. Transceiver IF 245 transfers the bi-directional channel signals between channel controller 240 and RF transceiver unit 250.

Antenna array 255 transmits forward channel signals received from RF transceiver unit 250 to mobile stations in the coverage area of BS 101. Antenna array 255 also sends to transceiver 250 reverse channel signals received from mobile stations in the coverage area of BS 101. In a preferred embodiment of the present invention, antenna array 255 is multi-sector antenna, such as a three sector antenna in which each antenna sector is responsible for transmitting and receiving in a 120° arc of coverage area. Additionally, transceiver 250 may contain an antenna selection unit to select among different antennas in antenna array 255 during both transmit and receive operations.

Figure 3:
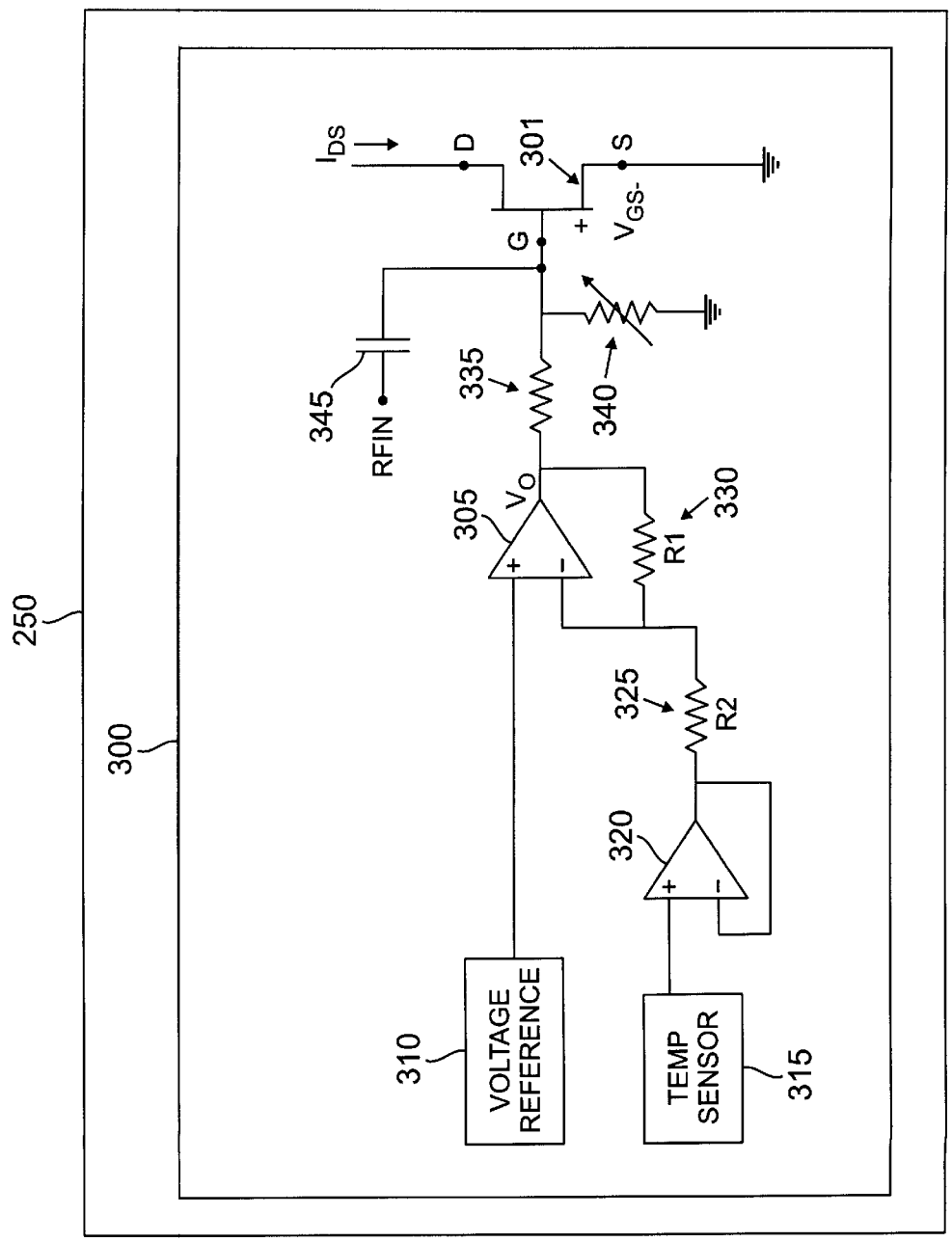
FIG. 3 illustrates in greater detail a temperature compensated bias network for use in an exemplary Class A/B RF amplifier in the RF transceiver in FIG. 2 in accordance with one embodiment of the present invention.

FIG. 3 illustrates in greater detail a temperature compensated bias network, generally designated 300, for use in an exemplary RF amplifier in RF transceiver 250 in accordance with one embodiment of the present invention. Bias network 300 maintains a constant desired quiescent current, $I_{dq}$, and device linearity in class AB laterally diffused metal-oxide-silicon field-effect transistor (LDMOS FET) 301. Although the discussion that follows is directed toward the biasing of a class AB LDMOS FET, it will be understood by those skilled in the art that the teachings of this disclosure may easily be adapted to bias a GaAs FET device or a BJT device. However, for the sake of simplicity, the following discussion will be limited to a class AB LDMOS FET device.

Bias network 300 comprises differential operational amplifier (OA) 305, which receives a first signal on a non-inverting input from voltage reference circuit 310 and a second buffered control signal on an inverting input from temperature sensor 315. The output of temperature sensor 315 is buffered by non-inverting, unity gain OA 320. The output of unity gain OA 320 is scaled by a gain factor determined by resistor 330 (referred to below as "R1") and resistor 325 (referred to below as "R2"). The resultant output of differential OA 305 is subsequently scaled by a voltage divider comprised of resistor 335 and variable resistor (potentiometer) 340. The RF input signal (RF IN) is supplied to the gate of LDMOS FET 301 by RF coupling capacitor 345.

Figure 4A:
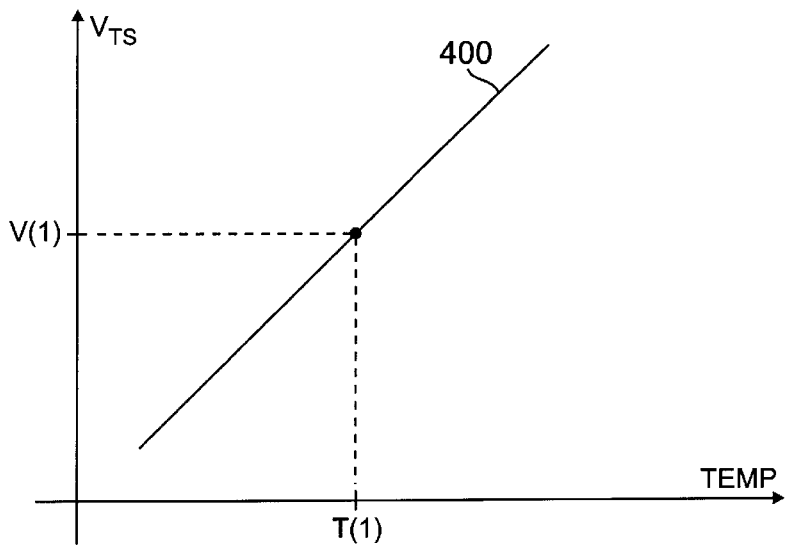
FIG. 4A illustrates a curve which represents the output response over temperature of an exemplary temperature sensor in accordance with one embodiment of the present invention.

FIG. 4A illustrates curve 400, which represents the voltage output of temperature sensor 315 across a range of temperatures in accordance with one embodiment of the present invention. As shown, temperature sensor 315 provides an output voltage ($V_{TS}$) that increases linearly with temperature (Temp) as depicted by the slope of curve 400. As previously described, OA 320 provides non-inverting, unity gain for the output voltage of temperature sensor 315. OA 320, in conjunction with R2, adjusts the high output impedance of temperature sensor 315 to an appropriate level for input to differential OA 305. This prevents the output impedance of temperature sensor 315 from negatively impacting the performance of differential OA 305. Since OA 320 provides unity gain, the output of OA 320 to R2 is similar to curve 400. Thus, the output of OA 320 varies linearly with the temperature sensor 315 output (control signal).

Voltage reference 310 provides a precise non-varying output voltage ($V_{REF}$) for input to the positive terminal of differential OA 305. The positive input terminal of differential OA 305 provides an output gain to the $V_{REF}$ signal equal to $G_P$, where $G_P=1+R1/R2$. The negative input terminal of differential OA 305 provides an output gain to the $V_{TS}$ signal equal to $G_n$, where $G_n=-R1/R2$. Therefore, differential OA 305 provides an output voltage ($V_O$) that is represented by:

$$V_O=(1+R_1/R_2)V_{REF}-(R_1/R_2)V_{TS}=V_{REF}+(R_1/R_2)(V_{REF}-V_{TS})$$

The above equations in conjunction with FIG. 4A show that $V_O$ decreases linearly with the increases in temperature. Thus, $V_O$ has the required characteristic for providing stable $I_{dq}$ over changes in temperature.

As shown by FIG. 3, $V_O$ is applied to a voltage divider comprised of resistor 335 and multi-turn potentiometer 340. When properly adjusted, potentiometer 340 provides the desired quiescent current, $I_{dq}$, and nominal operating voltage. In the case of the LDMOS FET, potentiometer 340 is adjusted, at room temperature (25° C.) for example, while monitoring the FET's quiescent current. Once $I_{dq}$ is obtained, potentiometer 340 is no longer changed.

Figure 4B:
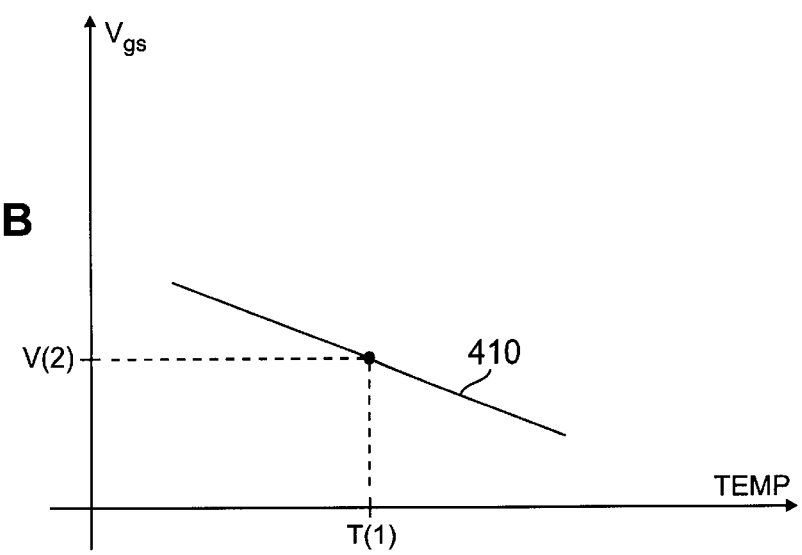
FIG. 4B illustrates a curve which represents the bias voltage response over temperature on the gate of an exemplary LDMOS FET according to one embodiment of the present invention.

FIG. 4B illustrates curve 410, which represents the gate-source bias voltage ($V_{GS}$) response over temperature on the gate of LDMOS FET 301 in accordance with one embodiment of the present invention. As shown by correlation of FIGS. 4A and 4B, when potentiometer 340 is adjusted at temperature T(1), for example 25° C., to produce $I_{dq}$, the resultant bias voltage $V_{GS}$=V(2). As previously described for bias network 300, V(2) is a function of $V_{TS}$ at T(1), which is shown as equal to V(1) in FIG. 4A. Once adjusted, temperature sensitive bias network 300 provides constant $I_{dq}$ for various values of $V_{TS}$ and $V_{GS}$ across the indicated temperature range.

Besides providing means for stable output of $I_{dq}$ across various temperature ranges, bias network 300 also provides the means for compensation of manufacturing, lot-to-lot FET (device) variations. Further, bias network 300 prevents FET thermal runaway by reducing the gate voltage as the temperature increases. Fixed-bias designs are not capable of such dynamic control.

One of the primary advantages of bias network 300 is its ability to provide a wide range of nominal quiescent currents and output voltages across temperature with a single adjustment. Bias network 300 also provides the ability to obtain more output power from a given device without complex, expensive bias circuitry. Without bias network 300, the power amplifier must be over-sized to ensure adequate performance over temperature. An over-sized power amplifier results in lower efficiency and higher cost, lower mean-time-to failure (MTTF), and larger and more costly heat sinking. Thus, bias network 300 allows the amplifier to operate at nominal output power over a wide temperature range.

Although the present invention has been described in detail, those skilled in the art should understand that they can make various changes, substitutions and alterations herein without departing from the spirit and scope of the invention in its broadest form.

What is claimed is:

1. For use in an RF amplifier containing an output power transistor having a quiescent current set at a selected bias current level, a biasing circuit for maintaining said quiescent current at said selected bias level comprising:
    a temperature sensor circuit capable of generating a temperature-sensitive control voltage that varies according to changes in temperature of said output power transistor; and
    a bias voltage generating circuit capable of detecting a variation in said temperature-sensitive control voltage and, in response thereto, adjusting a bias voltage applied to said output power transistor by an amount suitable to offset a change in said selected bias current level caused by a temperature change related to said variation in said temperature-sensitive voltage;
    amplification means for scaling a voltage change in said temperature-sensitive control voltage to match a required voltage change in said bias voltage; and
    an adjustable voltage divider circuit for further scaling said voltage change in said temperature-sensitive control voltage to match said required voltage change in said bias voltage.

2. The biasing circuit set forth in claim 1 wherein said bias voltage generating circuit comprises an operational amplifier having a first input coupled to an output of said temperature sensor circuit.

3. The biasing circuit set forth in claim 2 wherein said operational amplifier has a second input coupled to an output of a precision voltage reference circuit.

4. The biasing circuit set forth in claim 3 wherein an output of said operational amplifier is proportional to a difference between said precision voltage reference circuit output and said temperature sensor circuit output.

5. The biasing circuit set forth in claim 4 wherein said precision voltage reference circuit output provides a DC offset voltage in said operational amplifier output.

6. An RF amplifier comprising:
    an output power transistor having a quiescent current set at a selected bias level; and
    a biasing circuit for maintaining said quiescent current at said selected bias level comprising:
        a temperature sensor circuit capable of generating a temperature-sensitive control voltage that varies according to changes in temperature of said output power transistor; and
        a bias voltage generating circuit capable of detecting a variation in said temperature-sensitive control voltage and, in response thereto, adjusting a bias voltage applied to said output power transistor by an amount suitable to offset a change in said selected bias current level caused by a temperature change related to said variation in said temperature-sensitive voltage;
    amplification means for scaling a voltage change in said temperature-sensitive control voltage to match a required voltage change in said bias voltage; and
    an adjustable voltage divider circuit for further scaling said voltage change in said temperature-sensitive control voltage to match said required voltage change in said bias voltage.

7. The RF amplifier set forth in claim 6 wherein said bias voltage generating circuit comprises an operational amplifier having a first input coupled to an output of said temperature sensor circuit.

8. The RF amplifier set forth in claim 7 wherein said operational amplifier has a second input coupled to an output of a precision voltage reference circuit.

9. The RF amplifier set forth in claim 8 wherein an output of said operational amplifier is proportional to a difference between said precision voltage reference circuit output and said temperature sensor circuit output.

10. The RF amplifier set forth in claim 9 wherein said precision voltage reference circuit output provides a DC offset voltage in said operational amplifier output.

11. For use in an RF amplifier containing an output power transistor having a quiescent current set at a selected bias current level, a method for maintaining the quiescent current at the selected bias level comprising the steps of:
    generating a temperature-sensitive control voltage that varies according to changes in temperature of the output power transistor; and
    detecting a variation in the temperature-sensitive control voltage; and
    in response thereto, adjusting a bias voltage applied to the output power transistor by an amount suitable to offset a change in the selected bias current level caused by a temperature change related to the variation in the temperature-sensitive voltage;
    scaling a voltage change in the temperature-sensitive control voltage to match a required voltage change in the bias voltage; and
    scaling a voltage divider circuit to scale the voltage change in the temperature-sensitive control voltage to match the required voltage change in the bias voltage.

12. The method set forth in claim 11 wherein the steps of detecting and adjusting are performed by an operational amplifier having a first input coupled to the temperature-sensitive control voltage.

13. The method set forth in claim 12 wherein the operational amplifier has a second input coupled to a precision reference voltage.

14. The method set forth in claim 13 wherein an output of the operational amplifier is proportional to a difference between the precision reference voltage output and the temperature sensor circuit output.

* * * * *